(12) United States Patent
Kim et al.

(10) Patent No.: US 9,857,690 B2
(45) Date of Patent: Jan. 2, 2018

(54) EXTREME ULTRAVIOLET GENERATION DEVICE AND EXPOSURE SYSTEM INCLUDING THE SAME

(71) Applicant: SAMSUNG ELECTRONICS CO., LTD., Suwon-si, Gyeonggi-do (KR)

(72) Inventors: Hoyeon Kim, Seoul (KR); Jinseok Heo, Suwon-si (KR); Insung Kim, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/182,926

(22) Filed: Jun. 15, 2016

(65) Prior Publication Data

US 2017/0059998 A1    Mar. 2, 2017

(30) Foreign Application Priority Data

Aug. 28, 2015  (KR) .................. 10-2015-0122022

(51) Int. Cl.
| | | |
|---|---|---|
| *G03B 27/54* | (2006.01) | |
| *G03F 7/20* | (2006.01) | |
| *H05G 2/00* | (2006.01) | |
| *G02B 19/00* | (2006.01) | |

(52) U.S. Cl.
CPC ..... *G03F 7/70033* (2013.01); *G02B 19/0095* (2013.01); *G03F 7/70916* (2013.01); *H05G 2/001* (2013.01)

(58) Field of Classification Search
CPC ............ G02B 19/0095; G03F 7/70033; G03F 7/70916; H05G 2/001
USPC .......................................................... 355/67
See application file for complete search history.

(56) References Cited

U.S. PATENT DOCUMENTS

| | | | |
|---|---|---|---|
| 7,196,342 B2 | 3/2007 | Ershov et al. | |
| 7,459,708 B2 | 12/2008 | Inoue et al. | |
| 7,495,239 B2 | 2/2009 | Freriks et al. | |
| 7,649,186 B2 | 1/2010 | Kabuki et al. | |
| 7,960,701 B2 | 6/2011 | Bowering et al. | |
| 8,314,398 B2 | 11/2012 | Bowering et al. | |
| 8,507,883 B2 | 8/2013 | Endo et al. | |
| 8,686,370 B2 | 4/2014 | Bowering et al. | |
| 8,785,892 B2 | 7/2014 | Ershov et al. | |
| 2009/0059196 A1 | 3/2009 | Bakshi et al. | |
| 2010/0123086 A1* | 5/2010 | Yamatani .................. G01T 1/00 250/393 |
| 2015/0144538 A1 | 5/2015 | Lehmann | |

FOREIGN PATENT DOCUMENTS

| | | |
|---|---|---|
| JP | 2010-098299 A | 4/2010 |
| JP | 2011-515650 A | 5/2011 |
| KR | 10-0466093 B1 | 1/2005 |
| KR | 10-1114869 B1 | 3/2012 |
| KR | 10-2015-0023696 A | 3/2015 |

* cited by examiner

*Primary Examiner* — Peter B Kim
(74) *Attorney, Agent, or Firm* — Lee & Morse, P.C.

(57) ABSTRACT

An extreme ultraviolet generation device, including a chamber with an internal space; a plasma generator to generate plasma in the internal space; a condenser in the internal space to gather light generated from the plasma; and a monitor to monitor the internal space in an omnidirectional manner.

20 Claims, 8 Drawing Sheets

EXTREME ULTRAVIOLET GENERATION DEVICE AND EXPOSURE SYSTEM INCLUDING THE SAME

CROSS-REFERENCE TO RELATED APPLICATION

Korean Patent Application No. 10-2015-0122022, filed on Aug. 28, 2015, in the Korean Intellectual Property Office, and entitled: "Extreme Ultraviolet Generation Device and Exposure System Including the Same," is incorporated by reference herein in its entirety.

BACKGROUND

The present disclosure relates to an extreme ultraviolet generation device and an exposure system including the same.

As the reduction in pattern size of a semiconductor device continues, it is necessary to reduce the wavelength of light used for the exposure step, and thus, extreme ultraviolet is being currently used for the exposure step. For example, the extreme ultraviolet light is used in exposure or test steps. Since contaminants or debris may be produced in a device for generating the extreme ultraviolet light, it is necessary to accurately monitor the presence or amount of the contaminants or debris.

SUMMARY

Embodiments may be realized by providing an extreme ultraviolet generation device, including a chamber with an internal space; a plasma generator to generate plasma in the internal space; a condenser in the internal space to gather light generated from the plasma; and a monitor to monitor the internal space in an omnidirectional manner.

Embodiments may be realized by providing an exposure system, including a light source system generating light; an optical system to control and pattern the light; a substrate system to perform an exposure process on a substrate, using the patterned light; and a controller to control the light source system and the optical system, the light source system including a chamber providing an internal space, in which the light is generated; a plasma generator to generate plasma in the internal space; a condenser in the internal space to gather the light generated from the plasma; and a monitor to monitor the internal space in an omnidirectional manner.

Embodiments may be realized by providing an extreme ultraviolet generation device, including a plasma generator; a condenser; and a monitor, including a body, and a plurality of cameras and a plurality of illumination devices on or attached to the body; and aa driver to rotate the monitor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
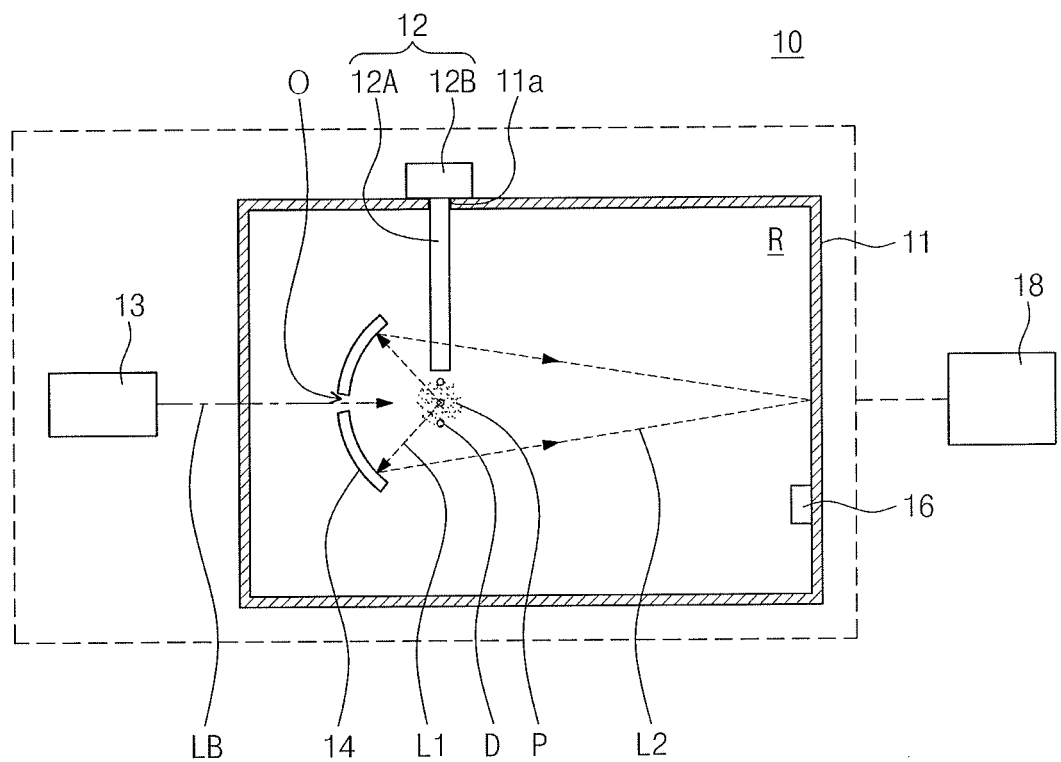
FIGS. 1 and 2 illustrate schematic diagrams of an extreme ultraviolet generation device including a monitoring unit according to embodiments.
Figure 2:
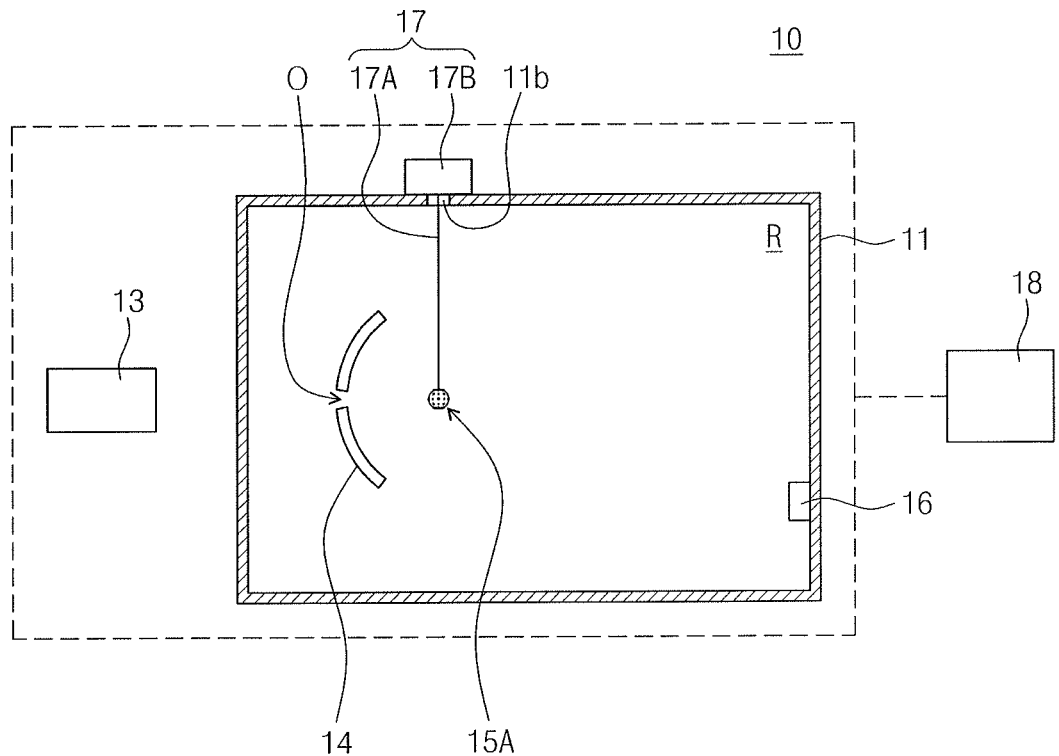
Figure 3:
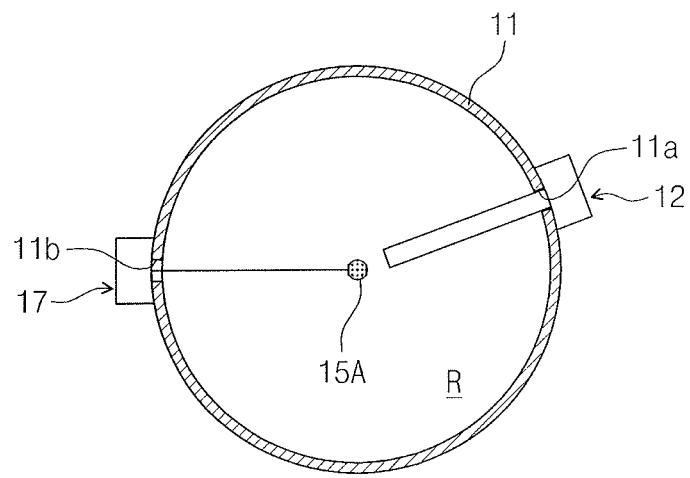
FIG. 3 illustrates a sectional view of a chamber of FIGS. 1 and 2.
Figure 4A:
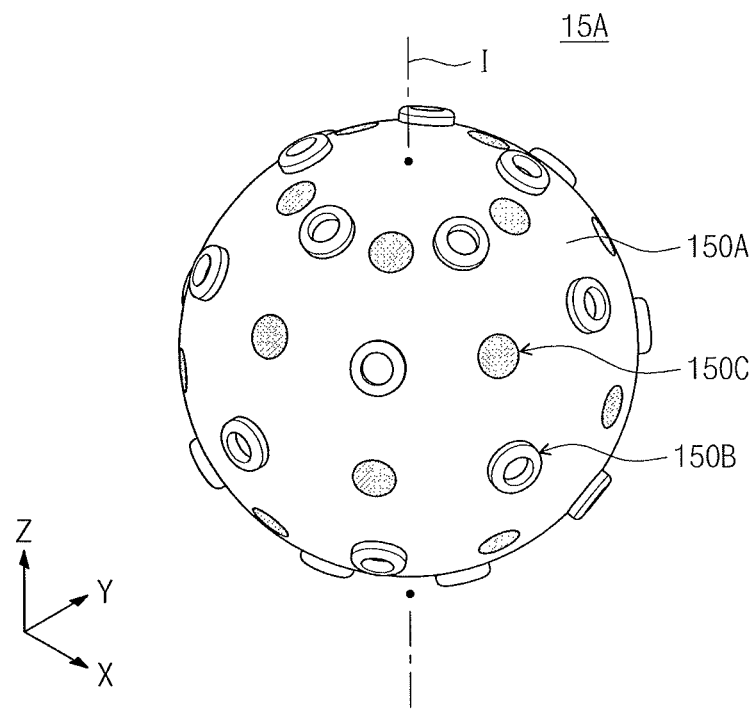
FIG. 4A illustrates an enlarged perspective view of a monitoring unit of FIG. 2.
Figure 4B:
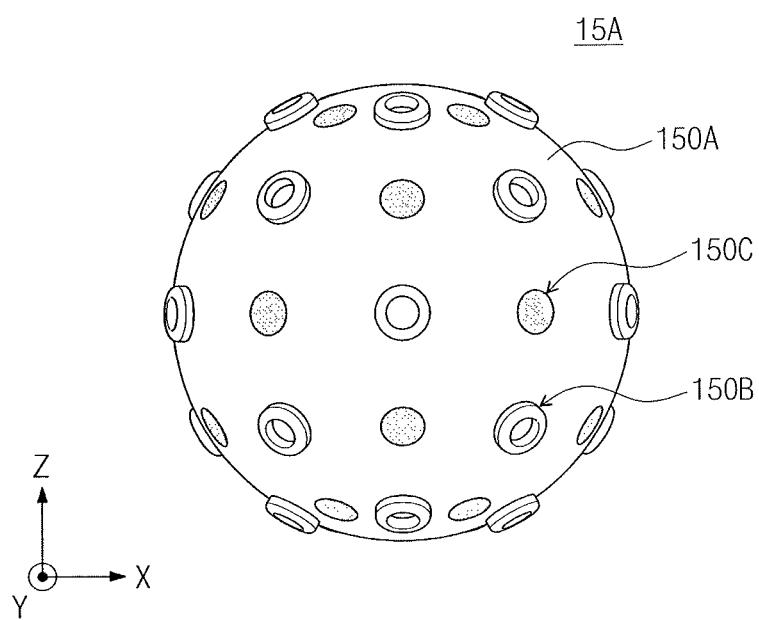
FIG. 4B illustrates a shape of a monitoring unit of FIG. 4A seen from an X-Z plane.
Figure 4C:
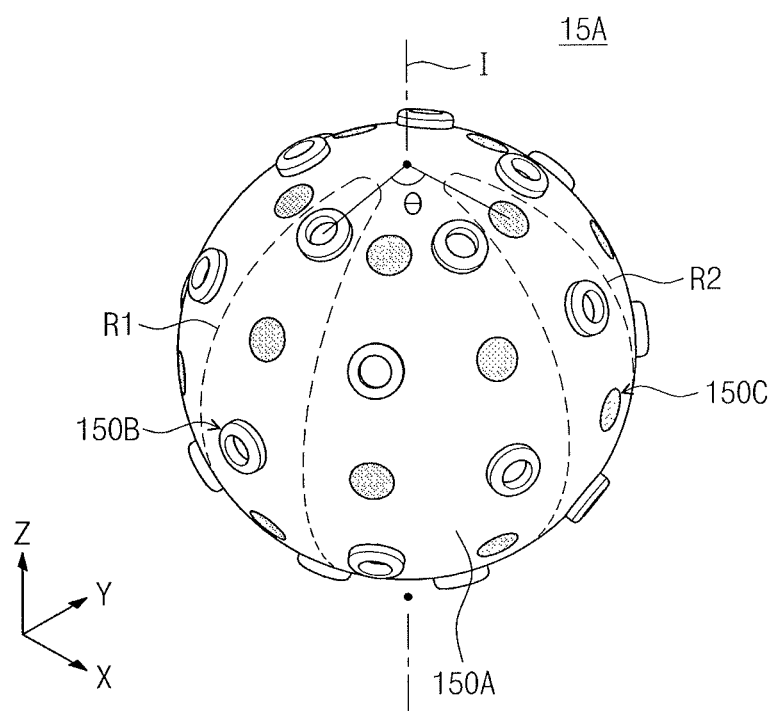
FIG. 4C illustrates a perspective view of an example of methods of controlling a monitoring unit by a control unit.

FIGS. 1 and 2 illustrate schematic diagrams of an extreme ultraviolet generation device 10 according to embodiments. FIG. 3 illustrates a sectional view of a chamber 11 shown in FIGS. 1 and 2. FIG. 4A is an enlarged perspective view of a monitoring unit 15A, and FIG. 4B illustrates a shape of the monitoring unit 15A of FIG. 4A seen from an X-Z plane. FIG. 4C illustrates a perspective view of a method of controlling the monitoring unit 15A by a control unit 18. Hereinafter, an example of the extreme ultraviolet generation devices according to embodiments will be described with reference to FIGS. 1 through 4C. Referring to FIG. 1, the extreme ultraviolet generation device 10 may include a chamber 11, a source unit 12, a plasma generation unit 13, a condensing unit 14, a monitoring unit 15A, a first sensor unit 16, and a driving unit 17. The extreme ultraviolet generation device 10 may be configured to generate extreme ultraviolet (EUV) whose wavelength range from about 10 nm to about 50 nm. For example, the extreme ultraviolet may have a wavelength of 13.5 nm.

The chamber 11 may provide an internal space R, in which an extreme ultraviolet light may be generated. The chamber 11 may be a vacuum chamber. The chamber 11 may be of a hollow type. A first opening 11a may be formed through one of walls of the chamber 11. The first opening 11a may be configured to allow the source unit 12 to be inserted into or extracted from the internal space R therethrough. A second opening 11b may be formed through another of the walls of the chamber 11. The second opening 11b may be configured to allow the monitoring unit 15A to be inserted into or extracted from the internal space R therethrough. The chamber 11 may include, for example, a vacuum pump and a vacuum gauge. The use of the vacuum chamber may make it possible to prevent a fraction of the extreme ultraviolet generated therein from being absorbed by the air molecules contained therein. In embodiments, the first and second openings 11a and 11b may be formed to have small widths, and it may be possible to maintain the internal space R to, e.g., at, a desired pressure (e.g., a vacuum pressure). The chamber 11 may include a heat-resistant material.

The source unit 12 may supply a source for generating the extreme ultraviolet light. The source unit 12 may be disposed in a region of the chamber 11. The source unit 12 may include a source portion 12A and a supporting portion 12B. The source portion 12A may be configured to provide a source material for generating the light. As an example, the source portion 12A may be configured to produce a droplet D. In the internal space R, the droplet D produced from the source portion 12A may move in a directly downward direction. In the case where a surface area of the droplet D is increased, light L1 produced from an interaction with a laser beam LB may have an increased energy. The supporting portion 12B may be coupled to a portion of the source portion 12A. The supporting portion 12B may be configured to close the first opening 11a and hermetically seal the chamber 11, when the source portion 12A is provided in the internal space R. The source unit 12 may further include an imaging part of collecting a droplet image containing information on a position of the droplet D and a control unit configured to perform a feedback process on the droplet D based on the droplet image. In embodiments, the source unit 12 may be provided in the form of a target containing a source material. The source material may contain one or more of xenon (Xe), lithium (Le), tin (Sn), neon (Ne), argon (Ar), or compounds thereof.

The plasma generating unit 13 may produce a plasma P from the source material. The plasma generating unit 13 may be provided outside the chamber 11. Referring to FIG. 1, the plasma generation unit 13 may be a laser-produced plasma (LPP) unit that may be configured to produce the plasma P using the laser beam LB. If the source material is irradiated by the laser beam LB emitted from the plasma generating unit 13, the light L1 may be generated from the plasma P. The laser beam LB may pass through an aperture O of the condensing unit 14 and then may be incident into the droplet D to generate the light L1. The light L1 may be generated to have various wavelengths. For example, the light L1 may include an extreme ultraviolet light L2. The laser beam LB may be a pulse with high intensity. In certain embodiments, the plasma generating unit 13 may include a discharge-produced plasma (DPP) unit configured to produce plasma using a high voltage to the source material. The plasma generation unit 13 may be configured to produce, for example, $CO_2$ laser, NdYAG laser, or free electron Laser (FEL).

The condensing unit 14 may be disposed in the internal space R. The condensing unit 14 may be configured to gather the light L1 produced from the plasma P. The light L1 may be reflected by the condensing unit 14 and may be focused on a specific point. The condensing unit 14 may be provided to have an antenna-shaped structure with an aperture O. The condensing unit 14 may be formed of or include a transparent material. As an example, the condensing unit 14 may include quartz. A filter unit may be provided to allow the extreme ultraviolet light L2 of the light L1 to pass therethrough. The filter unit may include zirconium (Zr). In certain embodiments, the extreme ultraviolet generation device 10 may further include at least one additional optical unit provided in the internal space R.

The monitoring unit 15A may be provided in the internal space R. The monitoring unit 15A may be configured to perform an omnidirectional imaging and monitoring operation on the internal space R. For example, the monitoring unit 15A may be configured to perform the omnidirectional imaging and monitoring operation on a surface of the condensing unit 14. For example, the monitoring unit 15A may measure a spatial distribution of contaminants on a surface of the condensing unit 14.

Referring to FIGS. 2, 4A, and 4B, the monitoring unit 15A may include a body 150A, a camera 150B, and at least one illumination device 150C. The body 150A may be provided to have a spherical shape. The body 150A may be inserted into the internal space R through the second opening 11b of the chamber 11, and may be small enough to pass through the second opening 11b. As an example, the body 150A may have a diameter ranging from about 8 cm to about 12 cm. The shape of the body 150A may be variously changed. The monitoring unit 15A may be configured to include a plurality of cameras 150B. Each of the cameras 150B may be used to perform an imaging and monitoring operation on a region of the internal space R. The plurality of cameras 150B may be provided on or attached to the body 150A. The monitoring unit 15A may be configured to include a plurality of illumination devices 150C. The illumination devices 150C may be used to control brightness of the internal space R. The illumination device 150C may be configured in such a way that optical properties (e.g., wavelength, intensity, or polarization) of light generated therein may be controlled by, for example, the control unit 18. The plurality of illumination devices 150C may be provided on or attached to the body 150A.

The cameras 150B and the illumination devices 150C may be uniformly dispersed on the body 150A. The cameras 150B may be arranged in such a way that each of them is interposed between the illumination devices 150C, and vice versa. For example, one of the illumination devices 150C may be disposed between adjacent ones (e.g., first and second cameras) of the cameras 150B, and one of the cameras 150B may be disposed between adjacent ones (e.g., first and second illumination devices) of the illumination devices 150C. The cameras 150B and the illumination devices 150C may form a variety of arrangements. The cameras 150B and the illumination devices 150C may be disposed to be symmetric about a central axis I of the body 150A. In embodiments, the cameras 150B and the illumination devices 150C may be disposed to be asymmetric about the central axis I of the body 150A. As shown in FIG. 4B, the cameras 150B and the illumination devices 150C may be disposed to form a 5×5 arrangement on a hemispherical surface. In embodiments, the cameras 150B and the illumination devices 150C may be allowed to have more freedom in terms of the number, arrangement, and density.

Referring to FIG. 4C, the control unit 18 may be configured to control the monitoring unit 15A. The control unit 18 may control an on/off switching operation on each of the cameras 150B and illumination devices 150C. Under the control of the control unit 18, at least one of the cameras 150B may be used to monitor the internal space R and at least one of the illumination devices 150C may be used to adjust an intensity of illumination in the internal space R. For example, the monitoring unit 15A may include a first region R1 and a second region R2 spaced apart from each other. In the case where a monitoring operation is performed on the internal space R, under the control of the control unit 18, the cameras 150B on the first region R1 may be used to obtain images of the internal space R and the illumination devices 150C on the second region R2 may be used to provide illumination light on the internal space R. The first region R1 and the second region R2 may be selected in such a way that a central angle θ (or an azimuthal angle) therebetween ranges from about 60° to about 120°. In embodiments, the central angle θ between the first and second regions R1 and R2 may be about 90°. The monitoring operation on the internal space R may be performed using the cameras 150B and the illumination devices 150C that are respectively positioned on two separated regions R1 and R2, and it may be possible to prevent the illumination devices 150C from causing reflection or interference issues. For example, it may be possible to prevent light emitted from the illumination devices 150C from being reflected by a reflective surface of the condensing unit 14 and being directly incident into the cameras 150B. The control unit 18 may be configured to allow at least one or some of the cameras 150B and the illumination devices 150C to be selectively turned on, and this may make it possible to selectively perform the monitoring operation on a desired region of the internal space R. The monitoring operation using the monitoring unit 15A may be performed in various manners, and this may make it possible to obtain more accurate and reliable image information on the internal space R.

The first sensor unit 16 may be provided in a region of the internal space R. The first sensor unit 16 may be configured to measure an output intensity of the extreme ultraviolet light L2 generated in the internal space R. In embodiments, a plurality of first sensor units 16 may be provided. The driving unit 17 may be coupled to the monitoring unit 15A to move the monitoring unit 15A. The driving unit 17 may include a connecting portion 17A and a driving portion 17B. The driving portion 17B may be configured to produce a driving force for moving the monitoring unit 15A, and the connecting portion 17A may be configured to transfer the driving force from the driving portion 17B to the monitoring unit 15A.

The control unit 18 may control the source unit 12, the plasma generation unit 13, the condensing unit 14, the monitoring unit 15A, the first sensor unit 16, and the driving unit 17. For example, when the source unit 12 and the monitoring unit 15A are inserted into or extracted from the internal space R through the first and second openings 11a and 11b, respectively, the control unit 18 may control the insertion and extraction operations of the source and monitoring units 12 and 15A. As shown in FIGS. 1 through 4C, the extreme ultraviolet generation device 10 may have two openings 11a and 11b for allowing the source and monitoring units 12 and 15A to be respectively inserted into or extracted from the internal space R, but in certain embodiments, the extreme ultraviolet generation device 10 may be configured to have a single opening for allowing the source unit 12 or the monitoring unit 15A to be selectively inserted into or extracted from the internal space R. The control unit 18 may control an operation of inserting or extracting one of the source unit 12 and the monitoring unit 15A into or from the internal space R through the single opening.

The control unit 18 may include an image display part. Under the control of the control unit 18, the image information obtained by the monitoring unit 15A may be displayed on the image display part. The control unit 18 may examine how an output intensity of the extreme ultraviolet light L2 is changed depending on a spatial variation in the amount of contaminants, from an analysis on the image information on the internal space R. For example, the control unit 18 may perform a correlation analysis on the spatial variation in the amount of contaminants and the output intensity of the extreme ultraviolet light L2 and may calculate a change in reflectance of the extreme ultraviolet light L2 which may be caused by, for example, the spatial variation in the amount of contaminants. For example, the control unit 18 may calculate reflectance of the light, from information on the spatial distribution of the contaminants and the output intensity of the light. An operation of cleaning the internal space R may be performed in a remote control manner or under the control of the control unit 18, based on image information displayed on the image display part.

In general, a process of generating the extreme ultraviolet light may be performed under condition of high temperature and may lead to unintentional production of debris. The environment of high temperature and the presence of the debris may lead to rapid deterioration of optical components provided in the extreme ultraviolet generation device 10 and the consequent degradation in optical properties (e.g., intensity) of the extreme ultraviolet light to be output from the extreme ultraviolet generation device 10. For example, debris may be adsorbed on a surface of the condensing unit 14 or each optical component. The condensing unit 14 may suffer from deterioration in light-gathering efficiency and reflection efficiency, and this may lead to a reduction in process efficiency of the extreme ultraviolet generation process. These technical issues may be overcome by performing the monitoring operation on the internal space R of the chamber 11. In the case where sizes of the openings 11a and 11b are decreased to reduce the difficulty in maintaining the vacuum pressure of the internal space R, it may be difficult to perform an imaging and monitoring operation on the internal space R. By contrast, according to embodiments, the extreme ultraviolet generation device 10 may be configured to perform an omnidirectional monitoring operation on the internal space R using the monitoring unit 15A with a small size, and it may be possible to obtain accurate image information on the whole region of the internal space R, without any omitted region, and to obtain exact information on a spatial variation in the amount of contaminants over the internal space R. For example, the use of the monitoring unit 15A may make it possible to obtain exact information on debris that is adsorbed on the surface of the condensing unit 14.

Figure 5:
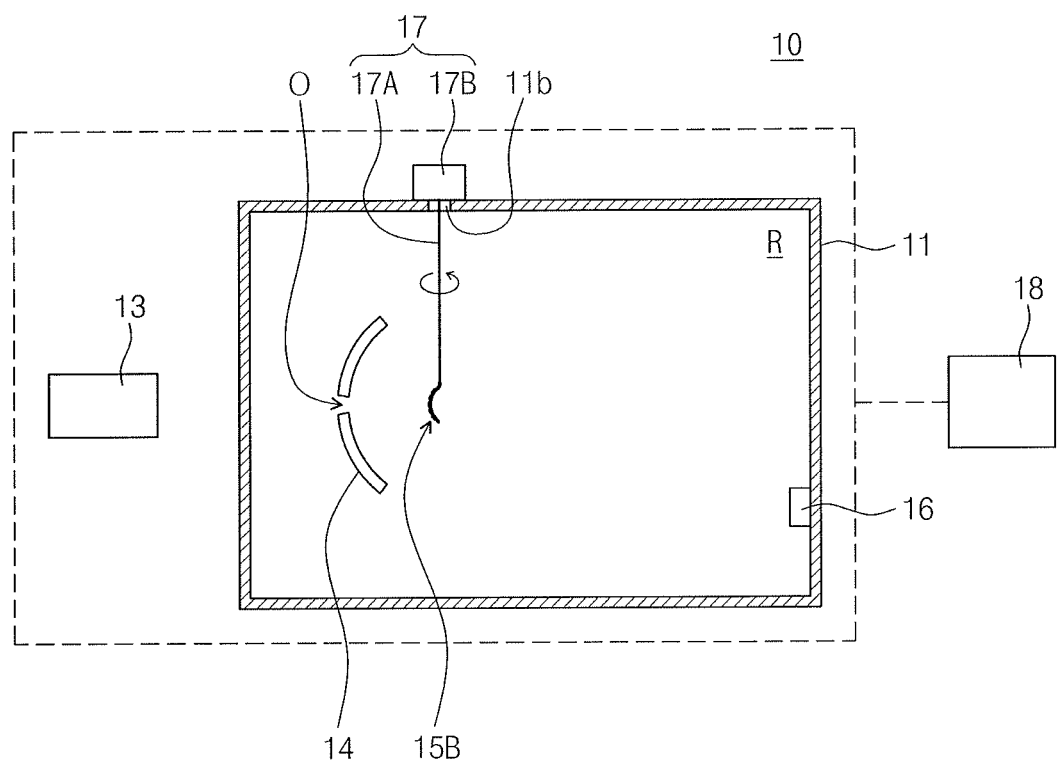
FIG. 5 illustrates a schematic diagram of an extreme ultraviolet generation device including a monitoring unit according to embodiments.
Figure 6:
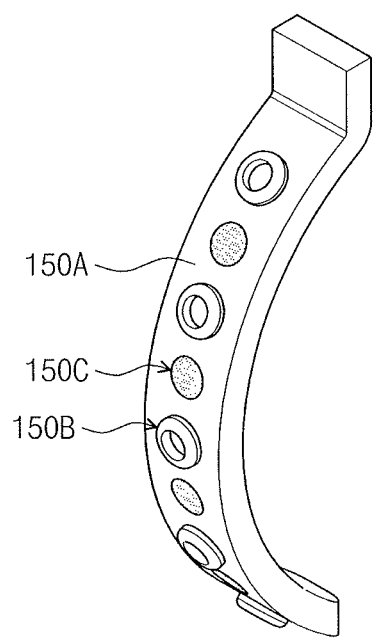
FIG. 6 illustrates an enlarged perspective view of a monitoring unit of FIG. 5.

FIG. 5 illustrates a schematic diagram of an extreme ultraviolet generation device 10 including a monitoring unit 15B according to embodiments. FIG. 6 may be an enlarged view of the monitoring unit 15B of FIG. 5. In the following description of the monitoring unit 15B, an element previously described with reference to FIGS. 1 through 4C may be identified by a similar or identical reference number without repeating an overlapping description thereof, for the sake of brevity. The monitoring unit 15B may include the body 150A, the camera 150B, and the illumination device 150C. Unlike the monitoring unit 15A of FIGS. 1 through 4C, the body 150A of the monitoring unit 15B may be provided in the form of a bar. A plurality of cameras 150B and a plurality of illumination devices 150C may be provided on or attached to the body 150A. As shown in FIG. 6, the cameras 150B and the illumination devices 150C may be disposed on a surface of the body 150A. The cameras 150B may be used to obtain images of the internal space R and perform a monitoring operation on the internal space R. The illumination devices 150C may be used to control brightness of the internal space R. Under the control of the control unit 18, some of the cameras 150B arranged along a longitudinal axis of the body 150A may be used to perform a monitoring or imaging operation on the internal space R, and some of the illumination devices 150C may be used to illuminate the internal space R. The monitoring unit 15B may be rotated by the driving unit 17, during the monitoring operation on the internal space R.

Figure 7:
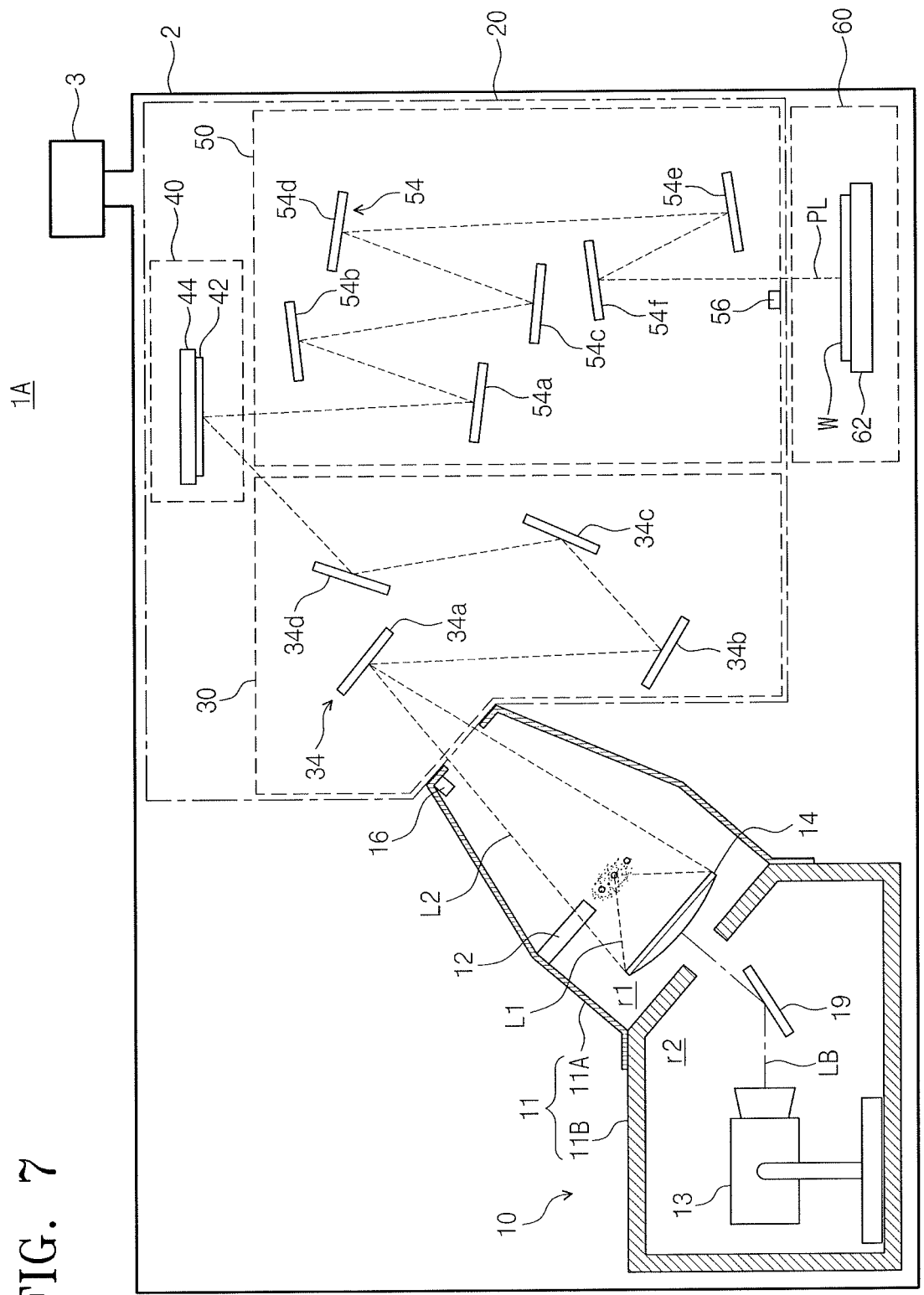
FIG. 7 illustrates a schematic diagram of an exposure system including an extreme ultraviolet generation device according to embodiments.

FIG. 7 illustrates a schematic diagram of an exposure system 1A including an extreme ultraviolet generation device 10 according to embodiments. The extreme ultraviolet generation device 10 may include at least one of the monitoring units 15A and 15B according to embodiments. Referring to FIG. 7, the exposure system 1A may include a chamber 2, a light source system 10, an optical system 20, a substrate system 60, and a control unit. The chamber 2 may be configured to contain the light source system 10, the optical system 20, and the substrate system 60 therein. The chamber 2 may be a vacuum chamber. The exposure system 1A may further include a vacuum pump 3 coupled to the chamber 2. The exposure system 1A of FIG. 7 may include the source unit 12 and the monitoring unit 15A, as described with reference to FIGS. 1 through 4C.

The light source system 10 may be configured to generate light. The light generated by the light source system 10 may be used in an exposure process to be performed on a substrate W. In embodiments, the light source system 10 may be configured to generate extreme ultraviolet (EUV) light. As an example, the light source system 10 may be configured to generate EUV light whose wavelength ranges from about 10 nm to about 50 nm. For example, the extreme ultraviolet may have a wavelength of 13.5 nm. The light source system 10 may be realized with the extreme ultraviolet generation device 10 described above. In embodiments, the chamber 11 may include a first chamber 11A and a second chamber 11B. The first chamber 11A may be configured to provide a first internal space r1, and the second chamber 11B may be configured to provide a second internal space r2. The first and second chambers 11A and 11B may be coupled to each other in such a way that the first and second internal spaces r1 and r2 are connected to each other, and the process of generating the extreme ultraviolet light may be performed under a vacuum pressure. In certain embodiments, the shape of the chamber 11 may be variously changed. For concise description, a previously described element may be identified by a similar or identical reference number without repeating an overlapping description thereof.

The optical system 20 may include the illuminating optical system 30, a mask system 40, and a projecting optical system 50. The illuminating optical system 30 may be configured to transmit light, which is incident from the light source system 10, to the mask system 40. The mask system 40 may be configured to pattern the light incident from the illuminating optical system 30. The projecting optical system 50 may be configured to transmit the light, which is incident from and patterned by the mask system 40, to the substrate system 60.

The illuminating optical system 30 may include a first reflecting member 34. The first reflecting member 34 may include a mirror. As an example, the first reflecting member 34 may be a multi-layered mirror. The first reflecting member 34 may include a plurality of first sub-reflecting members (e.g., 34a, 34b, 34c, and 34d). FIG. 7 shows an example in which four first sub-reflecting members (e.g., 34a, 34b, 34c, and 34d) are provided. The first sub-reflecting members 34a, 34b, 34c, and 34d may be configured to allow the extreme ultraviolet light L2 10 to be propagated from the light source system to the mask system 40. The first sub-reflecting members 34a, 34b, 34c, and 34d may be disposed to meet technical requirements (e.g., in uniformity and spatial variation on intensity) for the extreme ultraviolet light L2. The illuminating optical system 30 may include a gas supplying member. The gas supplying member may be configured to supply a cleaning gas (e.g., argon (Ar), hydrogen (H2), or nitrogen (N2)). In certain embodiments, the illuminating optical system 30 may further include its own vacuum chamber or vacuum pump. The illuminating optical system 30 may further include various lenses and/or optical components.

The mask system 40 may include a reticle 42 provided with circuit patterns and a reticle stage 44 supporting the reticle 42. The mask system 40 may be configured to pattern the light incident from the illuminating optical system 30. For example, the mask system 40 may be configured to selectively reflect light incident from the illuminating optical system 30. The mask system 40 may be configured to allow the patterned light to be incident into the projecting optical system 50.

The projecting optical system 50 may include a second reflecting member 54. The projecting optical system 50 may be configured to realize a reduction projection lithography process. The illuminating optical system 30 and the projecting optical system 50 may be connected to each other (e.g., in a single housing). In certain embodiments, the illuminating optical system 30 and the projecting optical system 50 may be provided in different housings, respectively. The second reflecting member 54 may include at least one mirror. As an example, the second reflecting member 54 may be a multi-layered mirror. The second reflecting member 54 may include a plurality of second sub-reflecting members (e.g., 54a, 54b, 54c, 54d, 54e, 54f). FIG. 7 shows an example in which six second sub-reflecting members (e.g., 54a, 54b, 54c, 54d, 54e, and 54f) are provided. The second sub-reflecting members 54a, 54b, 54c, 54d, 54e, and 54f may be configured to transfer the light, which is incident from and patterned by the mask system 40, to the substrate system 60. The projecting optical system 50 may include a gas supplying member. The gas supplying member may be configured to supply a cleaning gas (e.g., argon (Ar), hydrogen (H2), or nitrogen (N2)). In certain embodiments, the projecting optical system 50 may further include its own vacuum chamber or vacuum pump. The projecting optical system 50 may further include various lenses and/or optical components.

A second sensor unit 56 may be provided in a region of the projecting optical system 50. The second sensor unit 56 may be configured to measure an output intensity of the patterned light PL in the projecting optical system 50 and send information on the measured output intensities to the control unit. A plurality of second sensor units 56 may be provided in the projecting optical system 50. The position of the second sensor unit 56 may be variously changed; for example, the second sensor unit 56 may be provided near the mask system 40.

The substrate system 60 may include a supporting member 62. The substrate W may be loaded on a top surface of the supporting member 62. The supporting member 62 may further include a clamp immobilizing the substrate W. In certain embodiments, the supporting member 62 may be configured to support and immobilize the substrate W using a vacuum suction or electrostatic force. The light transmitted from the optical system 20 may be used to expose the substrate W, and patterns may be formed on the substrate W.

Under the control of the control unit, one of the source unit 12 and the monitoring unit 15A may be selectively inserted into the chamber 11 of the light source system 10, and it may be possible to selectively perform one of the exposure process using the extreme ultraviolet light L2 and the monitoring operation on the internal space R. For example, the monitoring operation may be periodically performed, according to a predetermined monitoring period of the internal space R. The image information obtained by the monitoring process may be used in a process of cleaning the chamber 11 in a remote control manner.

Figure 8:
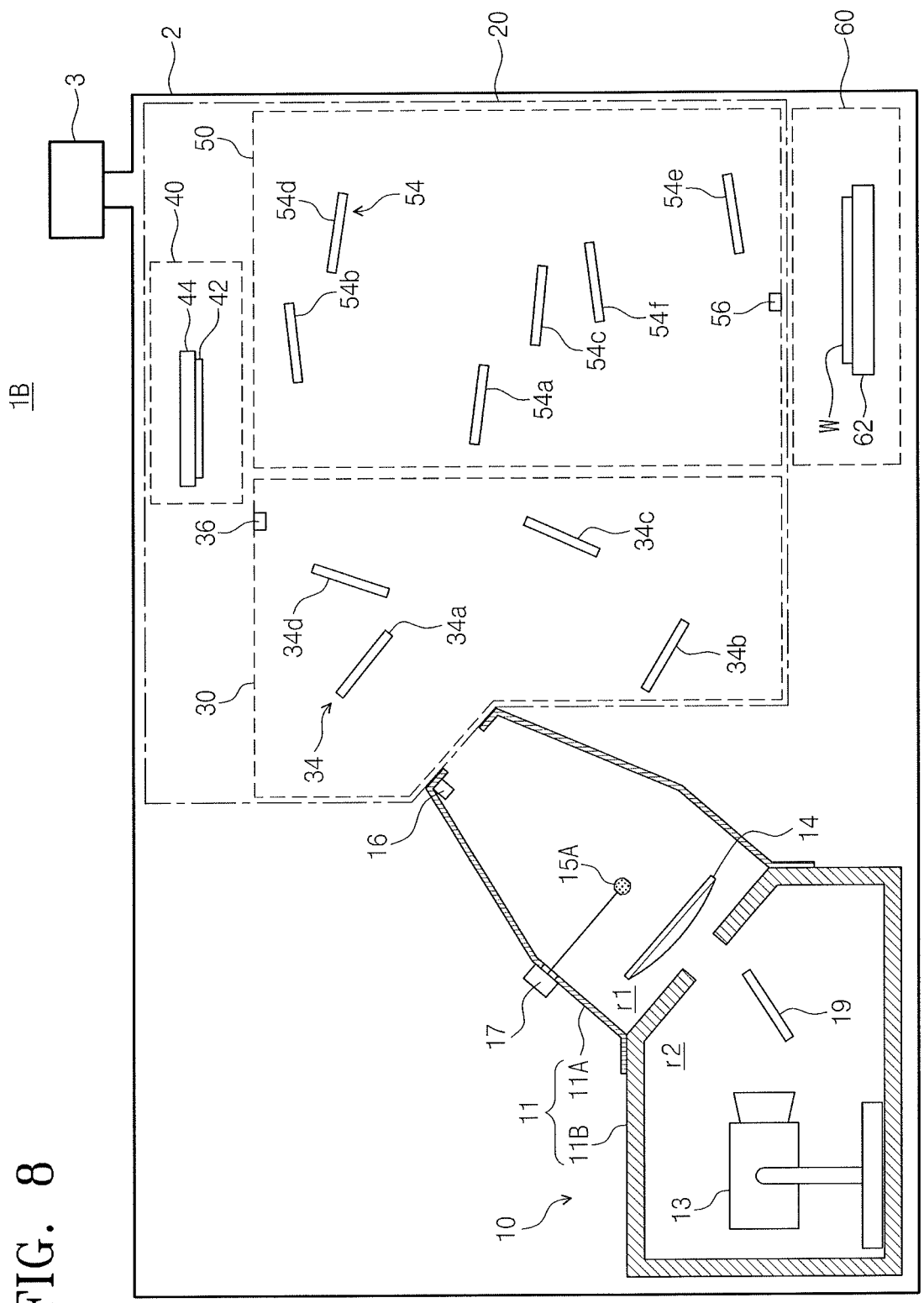
FIG. 8 illustrates a schematic diagram of an exposure system including an extreme ultraviolet generation device according to embodiments.

FIG. 8 illustrates a schematic diagram of an exposure system 1B including an extreme ultraviolet generation device 10 according to embodiments. The extreme ultraviolet generation device 10 may include at least one of the monitoring units 15A and 15B according to embodiments. Referring to FIG. 8, the exposure system 1B may include a chamber 2, a light source system 10, an optical system 20, a substrate system 60, and a control unit. In the following description of the exposure system 1B of FIG. 8, an element that has substantially the same features as that described with reference to the exposure system 1A of FIG. 7 may be identified by a similar or identical reference number without repeating an overlapping description thereof. In the exposure system 1B of FIG. 8, the extreme ultraviolet generation device 10 may be configured to insert or extract one of the source unit 12 and the monitoring unit 15A into the internal space R through a single opening. For example, the exposure system 1B may be configured to perform the exposure process using the source unit 12 and then to perform the monitoring operation, in which the monitoring unit 15A, instead of the source unit 12, may be used.

According to the afore-described embodiments, the extreme ultraviolet generation device 10 may be used as a part of the exposure system 1. In embodiments, the extreme ultraviolet generation device 10 may be used for other various processes, in which extreme ultraviolet light may be used. As an example, the extreme ultraviolet generation device 10 may be used for inspection or test systems using extreme ultraviolet light. A reticle-inspection system may be an example of such application. In embodiments, the exposure systems 1A and 1B have been described to include the light source system 10, the optical system 20, and the substrate system 60 provided in the chamber 2, but each of the light source system 10, the optical system 20, and the substrate system 60 may be configured to have its own vacuum chamber. The extreme ultraviolet generation device has been described as an example, for which an omnidirectional monitoring unit that may be capable of monitoring an object in an omnidirectional manner may be used, but the omnidirectional monitoring unit may be used for various devices or systems.

By way of summation and review, a photolithography process may include a photoresist-coating step of forming a photoresist layer on a semiconductor substrate, a soft-bake step of curing the photoresist layer (e.g., by removing solvent from the photoresist layer), an exposure step of transcribing an image of photomask patterns onto the cured photoresist layer, a development step of developing the photoresist layer to form photoresist patterns, and a post-bake step of curing photoresist patterns. As the reduction in pattern size of a semiconductor device continues, it may be necessary to reduce the wavelength of light used for the exposure step, and EUV may be used for the exposure step. For example, the EUV light may be used in exposure or test steps.

Contaminants or debris may be produced in a device for generating the EUV light, and such debris may be adsorbed on optical components (e.g., a condensing unit) of the EUV generation device. In order to know an internal state of the EUV generation device, it may be necessary to perform an imaging or monitoring operation on an inner space of the EUV generation device, e.g., to accurately monitor the presence or amount of the contaminants or debris.

According to embodiments, a monitoring unit may be configured to perform an imaging and monitoring operation in an omnidirectional manner. In embodiments, the monitoring unit may include a plurality of cameras and a plurality of illumination devices.

For example, the cameras and the illumination devices may be selectively controlled. For example, the imaging and monitoring operation may be performed using some of the cameras provided on a specific region and some of the illumination devices provided on other region, and it may be possible to prevent the illumination devices from causing undesired reflection or interference issues. Furthermore, it may be possible to obtain information on spatial distribution of contaminants and to examine a correlation between the spatial distribution of the contaminants and an output intensity of an extreme ultraviolet light, and this may make it possible to obtain data on a variation in reflectance of EUV light, which may be caused by, for example, the spatial distribution of the contaminants.

Embodiments may provide an extreme ultraviolet generation device, which may be configured to allow for an omnidirectional monitoring process on its inner space, and an exposure system including the same. Embodiments may provide an extreme ultraviolet generation device, which may be configured to allow its internal space to be examined by a monitoring process, and may allow for the estimation of the variation in output intensity of an extreme ultraviolet light caused by, for example, spatial distribution of contaminants, and an exposure system including the same.

The present disclosure relates to an extreme ultraviolet generation device and an exposure system configured to perform an exposure process using an extreme ultraviolet light.

According to embodiments, provided is a monitoring device that may be capable of performing an omnidirectional measurement on an internal space of an extreme ultraviolet generation device, in which extreme ultraviolet light may be generated. The use of the omnidirectional monitoring device may allow for an operator to accurately monitor the internal space without deformation of an image. The monitoring unit may include a plurality of cameras and a plurality of illumination devices, which may be selectively controlled by a control unit or the operator, and it may be possible to perform a monitoring operation on the whole or local region of the internal space. Furthermore, it may be possible to obtain information on a spatial variation in the amount of contaminants in the internal space, and this information, in conjunction with measurement data on an output intensity of an extreme ultraviolet light, may be used to determine a change in reflectance of the extreme ultraviolet light, which may be caused by, for example, the spatial variation in the amount of contaminants. The image information may be used to clean the internal space in a remote control manner.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An extreme ultraviolet generation device, comprising:
   a chamber with an internal space;
   a plasma generator to generate plasma in the internal space;
   a condenser in the internal space to gather light generated from the plasma; and
   a monitor to monitor the internal space in an omnidirectional manner.

2. The extreme ultraviolet generation device as claimed in claim 1, wherein the monitor includes:
a body; and
a plurality of cameras on the body.

3. The extreme ultraviolet generation device as claimed in claim 2, wherein the monitor further includes a plurality of illumination devices on the body.

4. The extreme ultraviolet generation device as claimed in claim 3, wherein:
each of the cameras is between adjacent ones of the plurality of illumination devices, and
each of the illumination devices is between adjacent ones of the plurality of cameras.

5. The extreme ultraviolet generation device as claimed in claim 3, further comprising a controller to control the monitor.

6. The extreme ultraviolet generation device as claimed in claim 5, wherein:
the body includes a first region and a second region that are spaced apart from each other, and
the controller controls the cameras and the illumination devices such that at least one of the cameras on one of the first and second regions images the internal space and at least one of the illumination devices on the other of the first and second regions illuminates the internal space, when the monitor monitors the internal space.

7. The extreme ultraviolet generation device as claimed in claim 6, wherein a central angle between the first region and the second region ranges from about 60° to about 120°.

8. The extreme ultraviolet generation device as claimed in claim 6, wherein the body has a spherical shape.

9. The extreme ultraviolet generation device as claimed in claim 5, wherein the controller receives information on positions of the cameras and images of the internal space obtained by the cameras and includes an image display part, which displays the images of the internal space.

10. The extreme ultraviolet generation device as claimed in claim 5, further comprising a sensor in the internal space to measure an output intensity of the light.

11. The extreme ultraviolet generation device as claimed in claim 10, wherein:
the monitor measures a spatial distribution of contaminants on a surface of the condenser, and
the controller calculates reflectance of the light, from information on the spatial distribution of the contaminants and the output intensity of the light.

12. An exposure system, comprising:
a light source system generating light;
an optical system to control and pattern the light;
a substrate system to perform an exposure process on a substrate, using the patterned light; and
a controller to control the light source system and the optical system,
the light source system including:
a chamber providing an internal space, in which the light is generated;
a plasma generator to generate plasma in the internal space;
a condenser in the internal space to gather the light generated from the plasma; and
a monitor to monitor the internal space in an omnidirectional manner.

13. The exposure system as claimed in claim 12, wherein the monitor includes:
a body;
a plurality of cameras on the body; and
a plurality of illumination devices on the body.

14. The exposure system as claimed in claim 13, wherein:
the body includes a first region and a second region spaced apart from each other, and
the controller controls the monitor such that at least one of the cameras on one of the first and second regions images the internal space and at least one of the illumination devices on the other of the first and second regions illuminates the internal space, when the monitor monitors the internal space.

15. The exposure system as claimed in claim 14, wherein:
the light source system further includes a first sensor to measure an output intensity of the light,
the optical system further includes a second sensor to measure an output intensity of the patterned light, and
the controller to calculate a variation in reflectance of the light caused by the spatial distribution of contaminants in the internal space, based on image information on a spatial distribution of contaminants in the internal space and information on a spatial variation in the output intensities measured by the first and second sensors.

16. An extreme ultraviolet generation device, comprising:
a plasma generator;
a condenser; and
a monitor, including:
a body, and
a plurality of cameras and a plurality of illumination devices on or attached to the body; and
a driver to rotate the monitor.

17. The extreme ultraviolet generation device as claimed in claim 16, wherein the body is in a form of a bar.

18. The extreme ultraviolet generation device as claimed in claim 17, wherein the monitor includes cameras along a longitudinal axis of the body.

19. The extreme ultraviolet generation device as claimed in claim 18, wherein the driver includes a connecting portion and a driving portion, the connecting portion to transfer a driving force from the driving portion to the monitor.

20. The extreme ultraviolet generation device as claimed in claim 19, wherein the connecting portion is attached to an end of the body along the longitudinal axis of the body.

* * * * *